United States Patent
MacFarlane et al.

[11] Patent Number: 5,920,086
[45] Date of Patent: Jul. 6, 1999

[54] LIGHT EMITTING DEVICE

[75] Inventors: Roger Morton MacFarlane, Menlo Park, Calif.; James Anthony Misewich, Croton-on-Hudson, N.Y.; Sanjay Sethi, Santa Clara, Calif.; Sandip Tiwari, Ossining, N.Y.

[73] Assignee: International Business Machines Corporation, Armonk, N.Y.

[21] Appl. No.: 08/972,980

[22] Filed: Nov. 19, 1997

[51] Int. Cl.⁶ .......................... H01L 33/00; H05B 33/14
[52] U.S. Cl. ................. 257/103; 257/43; 257/59; 257/72; 257/94; 257/96; 257/410; 257/613; 257/76
[58] Field of Search .................. 257/59, 76, 79, 257/200, 201, 613, 80, 82, 83, 86, 94, 96

[56] References Cited

U.S. PATENT DOCUMENTS

| | | | |
|---|---|---|---|
| 3,663,870 | 5/1972 | Tsutsumi et al. | 257/411 |
| 4,336,295 | 6/1982 | Smith | 428/195 |
| 4,666,793 | 5/1987 | Hirate | 428/690 |
| 4,864,462 | 9/1989 | Madou et al. | 361/280 |
| 5,319,653 | 6/1994 | Favennec et al. | 372/7 |
| 5,563,979 | 10/1996 | Bruce et al. | 385/142 |

FOREIGN PATENT DOCUMENTS 1920344  2/1971  Germany.

OTHER PUBLICATIONS

English translation of Batz '344, supra, Feb. 1971.
Rozhkov et al., Electical Breakdown of Rare Earth Oxide Insulator Thin Films in Silicon MIS Structures, 1995 IEEE 5th Conference on Conduction and Breakdown in Solid Electronics; pp. 418–422, Jul. 13, 1995.

H.Ennen et al. (1985) "1.54–$\mu$m Electroluminescence of Erbium–doped Silicon Grown by Molecular Beam Epitaxy", *Applied Physics Letters* 46:381–383.

D.L. Adler et al. (1992) "Local Structure of 1.54–$\mu$m Luminescence Er3+implanted in Si", *Applied Physics Letters* 61:2181–2183.

G. Franzò et al. (1994) "Room–temperature Electroluminescence from Er–doped Crystalline Si", *Applied Physics Letters* 64:2235–2237.

T. Kimura et al. (1994) "Electrochemical Er doping of Porous Silicon and its Room–temperature Luminescence at ~1.54 $\mu$m", *Applied Physics Letters* 65:983–985.

J. Michel et al. (1991) "Impurity Enhancement of the 1.54–$\mu$m Err3+ Luminescence in Silicon", *J. Applied Physics* 70:2672–2678.

R. Serna et al. (1994) "1.5 $\mu$m Room–temperature Luminescence from Er–implanted Oxygen–doped Silicon Epitaxial Films Grown by Molecular Beam Epitaxy", *J. Applied Physics* 75:2644–2647.

B. Zheng et al. (1994) "Room–temperature Sharp Line Electroluminescence at $\lambda$=1.54 $\mu$m from an Erbium–doped, Silicon Light–emitting Diode", *Applied Physics Letters* 64:2842–2842.

*Primary Examiner*—Jerome Jackson, Jr.
*Assistant Examiner*—Bradley William Baumeister
*Attorney, Agent, or Firm*—Scully, Scott, Murphy & Presser; Manny W. Schecter

[57] ABSTRACT

A device for generating radiant energy comprising a first electrode, a second electrode spaced apart from said first electrode, a material disposed between and in electrical communication with first and second electrodes, which emits radiant energy upon activation. This material is a rare earth metal oxide or a rare earth metal halide.

16 Claims, 1 Drawing Sheet

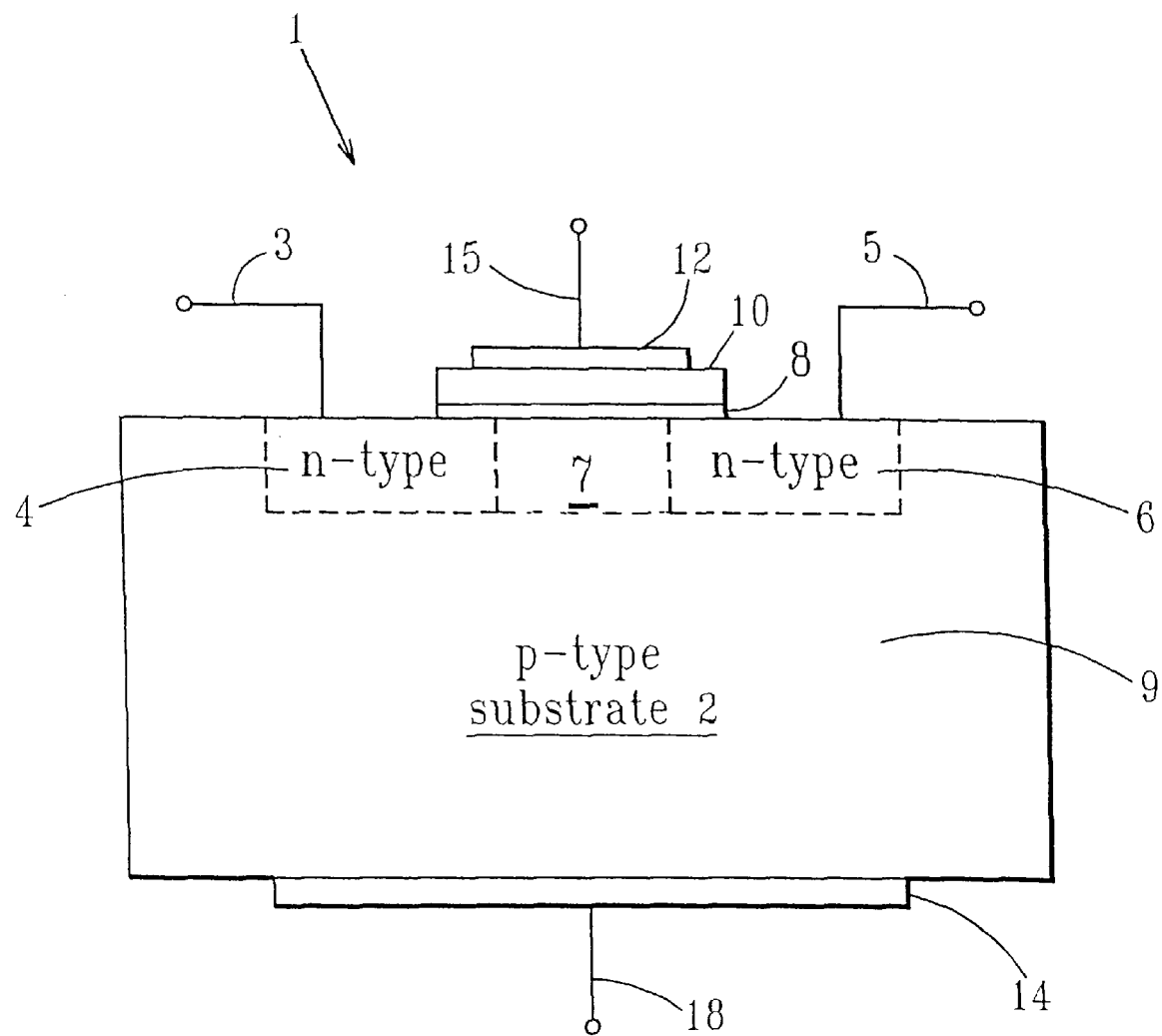

LIGHT EMITTING DEVICE

BACKGROUND OF THE DISCLOSURE

1. Field of the Invention

The present invention is directed to a device for generating radiant energy. More particularly, the present invention is directed to a device for generating radiant energy emitted by a rare earth metal oxide or rare earth metal halide in electrical communication with, and disposed between, a first and second electrode.

2. Description of the Prior Art

The development of light emitting devices is a major activity in the semiconductor arts. This is to be expected insofar as information propagation by means of harnessing light waves so generated represents a potential source of information transmission. Transmission by light waves removes speed and power restrictions associated with electrical wire transmission. Thus, the development of efficient light emitting semiconductor structures represents an attractive and burgeoning area of technical development.

Currently, the most efficient light-emitting semiconductor materials are direct-gap compound semiconductors e.g. III–V and II–VI materials.

However, severe processing constraints associated with these materials have prevented the development of very large scale integrated (VLSI) circuits utilizing these materials. Thus, attention has been directed to modifications of silicon-based semiconductors insofar as silicon semiconductors are the best developed and understood semiconductor materials. Unfortunately, silicon is an indirect bandgap semiconductor. As such, it exhibits extremely poor luminescence, whether electrically-pumped or optically-pumped.

In view of the above remarks recent research has focused on the manufacture of optoelectronic integrated circuits (OEICs) on silicon. This research has attempted to develop chip-to-chip interconnects, parallel processing and the integration of photonics on silicon chips. The integration of photonics on silicon chips require operation of a silicon-based light source at 1.54 microns. That wavelength corresponds to an absorption minimum in silica-based optical fibers. This, in turn, has focused upon the utilization of erbium-doped silica fiber amplifiers.

This latter development is the result of the fact that erbium atoms have a strong absorption band centered around 0.98 microns, corresponding to a $^4I_{15/2}$ to $^4I_{11/2}(4f^{11})$ transition and a strong emission spectrum centered around 1.54 microns, corresponding to a $^4I_{13/2}$ to $^4I_{15/2}(4f^{11})$ inner atomic transition. When Er-doped silica fiber is photopumped by semiconductor lasers emitting at 0.98 microns, the gain spectrum peaks around 1.54 microns. Thus, an optical signal, centered around 1.54 microns, passing through an Er-doped silica photopumped fiber would be greatly amplified. In fact, if sufficient population inversion were obtained, and a Fabry-Perot cavity created, an Er-doped fiber laser would be obtained.

In view of these scientific facts much activity has focused upon doping of silicon with erbium to effectuate the aforementioned results. Franzo et al., *Applied Physics Letters*, 64, 2235, (1994) and Michel et al. *Applied Physics Letters*, 64, 2842 (1994) describe ion implantation of erbium into silicon. Serna et al., *J. ADpl. Phys.*, 75, 2644 (1994) sets forth Er incorporation during molecular beam epitoxy growth. Michel et al., *J. A)pl. Phys.*, 70, 2672 (1991) describes the coimplantation of oxygen, carbon, nitrogen and fluorine with erbium into silicon.

Surprisingly, these studies emphasize that luminescence intensity depends strongly on the concentration of other impurities. Indeed, these studies indicate that the presence of oxygen is imperative for light emission with acceptable quantum efficiency. Alder et al. *Appl. Phys. Letters*, 61, 2180 (1992) found that extended X-ray absorption fine-structure (EXAFS) measurements from erbium implanted by the Czochralski (CZ) method and by the float-zone (FZ) technique produce dramatically different local structures around Er with respect to coordination number, type of atom and bond length. These studies show that the first coordination shell in Er: FZ Si closely resemble the 12 Si atoms in $ErSi_2$, whereas the first shell around Er in the CZ technique resembles the 6 oxygen atoms in $Er_2O_3$. This explains how the local chemical environment around Er determines its optical activity, i.e. Er in Si effectively acts as a microscopic getter, reacting in with Si only when either the amount of or accessability to oxygen is limited. Since the sixfold oxygen coordination to erbium cannot be centrosymmetric, the crystal field of the Si host lattice breaks inversion symmetry and mixes states of opposite parity, allowing the $^4I_{13/2}$ to $^4I_{15/2}$ transition (which is dipole forbidden in the free atom) to take place. Because the magnitude of the crystal-field splitting, which determines the transition probability, depends on the symmetry and chemical nature of the ligands bound to Er, the two different local environments in CZ and FZ lead to very different degrees of optical activity.

The prior art, i.e. Ennan, et al, *Appl. Phys. Letters*, 46, 381 (1985), reports photoluminescence and electroluminescence from Er-doped Si. the aforementioned Franzo et al. and Michel et al. *Applied Physics Letters* articles report the formation of light emitting diodes (LEDs) fabricated in silicon $p^+$–$n^+$ diodes with Er and O co-doping at the metallurgical junction region. Kimura et al., *Appl. Phys. Letters*, 65, 983 (1994) reports electrochemical Er doping of porous Si and the room temperature luminescence of the so-doped silicon at 1.54 microns.

In spite of the above discussed activities, the introduction of erbium into silica has not produced the requisite quantum efficiency necessary to commercialize this advance. The above discussed scientific developments indicate that erbium-oxygen complexes are crucial to intra-shell luminescence. However, carrier transfer to these complexes from a host silicon lattice remains unsolved. Therefore, there is a continuing need in the art for further development of erbium and other rare earth metal modified silicon semiconductors to provide light-emitting devices.

BRIEF SUMMARY OF THE INVENTION

A solution to the problem of poor quantum efficiency has now been discovered which permits silicon semiconductor materials to be used, in conjunction with rare earth metal compounds, to produce effective light-emitting semiconductor materials. This discovery overcomes the inherent inefficiencies associated with rare earth metal implantation in silicon. Instead of rare earth metal doping of silicon, a new device has been devised which utilizes rare earth metals in conjunction with a silicon chip to produce radiant energy more efficiently than the methods utilized in the prior art.

In accordance with the present invention a device for generating radiant energy is provided which includes a first electrode and a second electrode, spaced apart from the first electrode. A material, selected from the group consisting of rare earth metal oxides and rare earth metal halides, is disposed between and in electrical communication with the first and second electrodes.

In further accordance with the present invention a field effect transistor is disclosed. The field effect transistor includes a source region and a drain region formed in a first semiconductor material. A channel region is thus formed between the source region and the drain region on the surface of the first semiconductor material. A first electrode is electrically connected to the source region and a second electrode is connected to the drain region. A second material, a rare earth metal oxide or a rare earth metal halide, is disposed above the. surface between the first and second electrodes together with a low interface-state oxide and is in electrical communication with them. A gate electrode is disposed over the second material.

BRIEF DESCRIPTION OF THE DRAWING

The present invention will be better understood with reference to the accompanying drawing which is a schematic representation of a light-emitting device in accordance with the present invention.

DETAILED DESCRIPTION

The light emitting device of the present invention is generally depicted at 1 region of the drawing. The device 1 includes a substrate 2 which includes a p-doped silicon region 9. Two donor doped silicon portions of substrate 2 is n-type, denoted at 4 and 6, are connected to first and second electrodes 3 and 5, respectively. A channel region generally encompasses the region in the substrate 2 between the n-type electrodes 4 and 6 and is defined by electron inversion due to presence of bias at the gate electrode 12. The channel region 7 broadly occupies an area bordered by the bottom an insulator 8, the dotted line and inner edges of regions 4 and 6 as illustrated in the drawing. The just mentioned insulator 8 is disposed over the channel region 7 but also extends over portions of the donor doped first and second electrodes 4 and 6. In a preferred embodiment the insulating layer 8 is silica.

A second material 10, the first material being the semiconductor material of a rare earth metal oxide or a rare earth metal halide, is disposed atop the insulating layer 8. Preferably, the rare earth metal of the earth metal oxide or rare earth metal halide compound is erbium, samarium, europium, terbium, ytterbium, neodymium or gadolinium. Of the rare earth metals utilized in the rare earth metal compound which constitutes second material 10, erbium is most preferred.

In the preferred embodiment wherein the second material 10 is a rare earth metal halide, the halogen of that compound is preferably fluorine, chlorine or iodine. Of these, fluorine is more preferred.

In a particularly preferred embodiment of the second material 10 that material is erbium oxide having the structural formula $Er_2O_3$ or erbium fluoride having the structural $ErF_3$.

The device 1 includes a gate electrodes 12 and 14 in electrical communication with electrical conducts 15 and 18 respectively. The material of construction of gate electrode 12 is restricted to a material which is transparent at the wave frequency at which the rare earth metal generates radiant energy, as discussed below. Thus, in a preferred embodiment, wherein the rare earth metal of the second material 10 is erbium, the material of construction of the gate electrode 12 is cadmium tin oxide (CTO) or indium tin oxide (ITO). CTQ or ITO is transparent at a wavelength of 1.54 microns. The second gate electrode 14, not in the path of the emitted light from material 10, need not be so limited. Thus, other materials, in addition to cadmium tin oxide, normally used in gate electrodes are usable as the second gate electrode 14. For example, aluminum, a preferred material of construction of gate electrodes, is a preferred material of construction of gate electrode 14.

The device 1, in a preferred embodiment, acts as a field effect transistor. Thus, the transistor includes the components mentioned above in the discussion of device 1. In the parlance of field effect transistors, the donor doped portion 4 represents a source region while the donor doped portion 6 of substrate 2 is the drain region. The first electrode 3 is electrical connected to the source region 4 and the second electrode 5 is electrically connected to the drain region 6.

The light emitting device 1 operates upon imposition of a voltage between the first and second electrodes 3 and 5. A second voltage is imposed across the substrate 2 by the imposition of a voltage difference at 16 and 18 which are in electrical communication with gate electrodes 12 and 14, respectively. This, in turn, drives the device, which may be said to be a metal oxide semiconductor field effect transistor, into breakdown, with hot electrons being injected from the valence band of the positively doped silicon region 9 into the second material 10 layer. These impact-ionized carriers cause excitement of rare earth metal ions from a ground state to an excited state, whereupon light is emitted. For example, in the preferred embodiment wherein the material 10 is $Er_2O_3$, $Er^{+++}$ ions are excited from the ground state $^4I_{15/2}$ to either of the excited states, viz., the $^4I_{13/2}$ state or the $^4I_{11/2}$ state. In the latter case, the $Er^{+++}$ ions relax non-radioactively into the $^4I_{13/2}$ state and then emit light at a wavelength of 1.54 microns during the transition from the $^4I_{13/2}$ to the $^4I_{15/2}$ state.

As emphasized above, the gate electrode 12 must be fabricated of a transparent metallic layer. Thus, cadmium tin oxide, which is transparent at a wavelength of 1.54 microns, is well suited for use as the gate electrode 12 when the rare earth metal of the rare earth compound of material 10 is erbium. Other metallic or metal-like materials, such as polysilicon, epitaxially-deposited silicon or conducting oxides such as indium tin oxide, may also be employed as the gate electrode 10 consistent with the use of a rare earth metal that radiates energy at a wavelength at which these materials are transparent.

A preferred application of the device 1 is in the fabrication of a dielectric waveguide for guiding light, emitted from the electroluminescent device to a light conduit, e.g., an optical fiber.

The above preferred embodiments are given to illustrate the scope and spirit of the present invention. These embodiments will make apparent, to those skilled in the art, other embodiments and examples. These other embodiments and examples are within the contemplation of the present invention. Therefore, the present invention should be limited only by the appended claims.

What is claimed is:

1. A device for generating radiant energy comprising a first electrode; a second electrode spaced apart from said first electrode; a light-emitting material disposed between and in electrical communication with said first and second electrodes, wherein said light-emitting material is a rare earth metal oxide or a rare earth metal halide.

2. A device in accordance with claim 1 wherein said rare earth metal of said rare earth metal oxide or said rare earth metal halide is selected from the group consisting of erbium, samarium, europium, terbium, ytterbium, neodymium and the gadolinium.

3. A device in accordance with claim 2 wherein said rare earth metal of said rare earth metal oxide or said rare earth metal halide is erbium.

4. A device in accordance with claim 1 wherein said light-emitting material is a rare earth metal halide wherein said halogen component of said halide is selected from the group consisting of fluorine, chlorine and iodine.

5. A device in accordance with claim 4 wherein said halogen of said rare earth metal halide is fluorine.

6. A device in accordance with claim 1 wherein said light-emitting material is erbium oxide having the formula $Er_2O_3$.

7. A device in accordance with claim 1, wherein said material is erbium fluoride having the structural formula $ErF_3$.

8. A field effect transistor comprising a source region and a drain region formed in a semiconductor material; a channel region disposed between said source region and said drain region at the surface of said semiconductor material; a first electrode electrically connected to said source region; a second electrode electrically connected to said drain region; a light-emitting material disposed over said channel and situated between said first electrode and said second electrode; and a gate electrode disposed over said second material, wherein said light-emitting material is a rare earth metal oxide or a rare earth metal halide.

9. A transistor in accordance with claim 8 wherein said rare earth metal of said rare earth metal oxide or said rare earth metal halide is selected from the group consisting of erbium, samarium, europium, terbium, ytterbium, neodymium and gadolinium.

10. A transistor in accordance with claim 9 wherein said rare earth metal is erbium.

11. A transistor in accordance with claim 8 wherein said light-emitting is a rare earth metal halide in which said halogen of said rare earth metal halide is selected from the group consisting of fluorine, chlorine and iodine.

12. A transistor in accordance with claim 11 wherein said halogen is fluorine.

13. A transistor in accordance with claim 8 wherein said light-emitting material is erbium oxide having the structural formula $Er_2O_3$.

14. A transistor in accordance with claim 8 wherein said light-emitting material is erbium fluoride having a structural formula $ErF_3$.

15. A transistor in accordance with claim 8 wherein said gate electrode is transparent at the emission wavelength of the rare earth metal of said second material.

16. A transistor is accordance with claim 15 wherein said gate electrode is cadmium tin oxide.

\* \* \* \* \*